United States Patent [19]
Falster et al.

[11] Patent Number: 6,100,167
[45] Date of Patent: Aug. 8, 2000

[54] PROCESS FOR THE REMOVAL OF COPPER FROM POLISHED BORON DOPED SILICON WAFERS

[75] Inventors: Robert J. Falster, Milan; Fabrizio Leoni; Marco Bricchetti, both of Novara; Alessandro Corradi, Milan, all of Italy

[73] Assignee: MEMC Electronic Materials, Inc., St. Peters, Mo.

[21] Appl. No.: 09/082,905

[22] Filed: May 21, 1998

Related U.S. Application Data

[60] Provisional application No. 60/047,888, May 29, 1997.

[51] Int. Cl.[7] ............................. C30B 15/12; H01L 21/20; H01L 21/36
[52] U.S. Cl. ......................... 438/502; 438/500; 438/501; 438/503
[58] Field of Search .................................. 438/247, 502, 438/503, 501, 500, 471

[56] References Cited

U.S. PATENT DOCUMENTS

| | | | |
|---|---|---|---|
| 4,144,099 | 3/1979 | Edmonds et al. | 148/1.5 |
| 4,231,809 | 11/1980 | Schmidt | 148/1.5 |
| 4,732,874 | 3/1988 | Sparks | 437/247 |
| 4,878,988 | 11/1989 | Hall et al. | 156/600 |
| 4,994,399 | 2/1991 | Aoki | 437/11 |
| 5,272,119 | 12/1993 | Falster | 437/247 |
| 6,008,140 | 12/1999 | Ye et al. | 438/742 |
| 6,012,970 | 1/2000 | Nagabushnam et al. | 451/41 |
| 6,020,639 | 2/2000 | Ulrich et al. | 257/750 |
| 6,022,265 | 2/2000 | Drill et al. | 0/56 |

FOREIGN PATENT DOCUMENTS 39 39 661 A1  6/1991  Germany.

OTHER PUBLICATIONS

D. Chopra et al. "Cu Dissolution from Si(111) into an SC–1 Process Solution" Journal of Electrochemical Society, vol. 145, No. 4 (Apr. 1998) pp. L60–L61.

T. Imaoka et al. "The Segregation and Removal of Metallic Impurities at the interface of Silicon Wafer Suface and Liquid Chemicals" IEICE Transactions on Electronics, vol. E75–C, No. 7 (Jul. 1992) pp. 816–828.

(List continued on next page.)

*Primary Examiner*—Matthew Smith
*Assistant Examiner*—Granvill Lee
*Attorney, Agent, or Firm*—Senniger, Powers, Leavitt & Roedel

[57] ABSTRACT

A process for removing copper from a boron doped, polished silicon wafer which contains copper on its polished surface and in its interior. In the process, the wafer is annealed at a temperature of at least about 75° C. to increase the concentration of copper on the polished surface of the wafer and decrease the concentration of copper in the interior of the wafer. The polished surface of the annealed wafer is then cleaned to reduce the concentration of copper thereon. In addition, the annealing step is carried out at a temperature and a time such that the concentration of copper on the polished surface of the silicon will not increase by a factor of more than two upon storage of the annealed and cleaned wafer at room temperature for a period of 5 months.

17 Claims, 2 Drawing Sheets

OTHER PUBLICATIONS

T. Ohnishi et al. "Multipurpose Cleaning by $H_2SO_4/H_2O_2/$HF Solution" Abstract from the International Conference on Solid State Devices and Materials, Tokyo, Japan (Aug. 1993), pp. 627–629.

A. Mesli et al. "Copper Related Defect Reactions in P–Type Silicon" Materials Science Forum, vol. 83–87 (1992) pp. 161–166.

C. Neumann et al. Ultra–trace Analysis of Metallic contaminations on Silicon Wafer Surfaces by Vapour Phase Decomposition/Total Reflection X–Ray Fluorescence (VPD/TXRF), Spectrochemica Acta., vol. 46B, No. 10 (1991) pp. 1369–1377.

TH. Prescha et al. "Interaction of a Copper–Induced Defect With Shallow Acceptors and Deep Centers in Silicon" Materials Science Forum, vol. 83–87 (1992) pp. 167–172.

H. Prigge et al. "Acceptor Compensation in Silicon Induced by Chemomechanical Polishing" J. Electrochem. Soc., vol. 138, No. 5 (May 1991) pp. 1385–1389.

A. Schnegg et al. "Effects in Silicon Explained by Atomic Hydrogen" Mat. Res. Soc. Symp. Proc., vol. 104 (1988) pp. 291–296.

M. Shabani et al. "Low–Temperature Out–Diffusion of Cu from Silicon Wafers" J. Electrochem. Soc., vol. 143, No. 6 (Jun. 1996) pp. 2025–2029.

F. Shimura "Semiconductor Silicon Crystal Technology" Academic Press, Inc. (1989) pp. 188–191 and Appendix XII.

N. Streckfuβ et al. "Analysis of Trace Metals on Silicon Surfaces" Fresenius J. Anal Chem., vol. 343, No. 9/10 (1992) pp. 765–768.

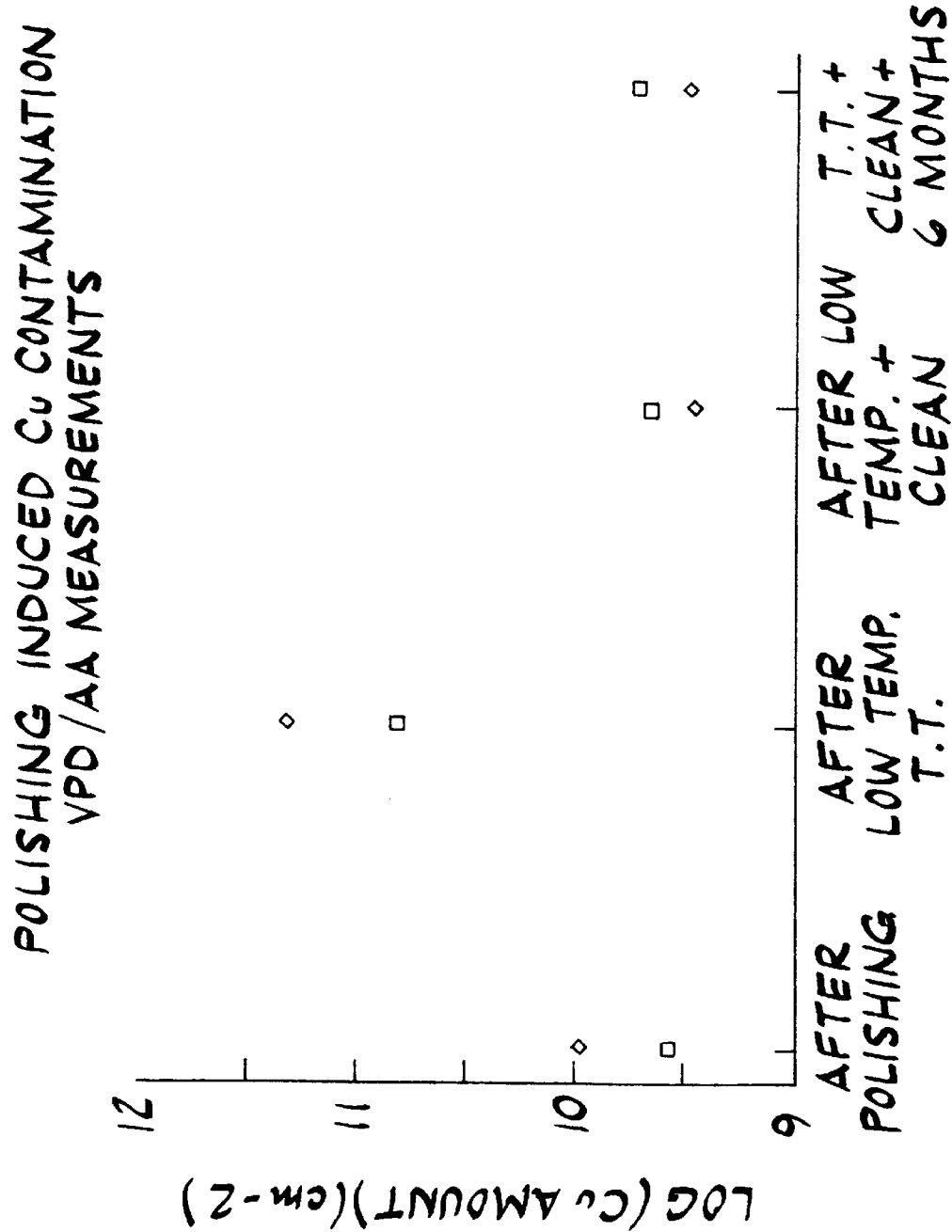

PROCESS FOR THE REMOVAL OF COPPER FROM POLISHED BORON DOPED SILICON WAFERS

REFERENCE TO RELATED APPLICATION

This application is a non-provisional application claiming priority from U.S. provisional application Ser. No. 60/047,888, filed on May 29, 1997.

BACKGROUND OF THE INVENTION

The present invention relates generally to a process for removing copper which is present in boron doped silicon wafers and, more particularly, to a process for diffusing copper from the bulk to the surface of such wafers from which it can be removed while avoiding the formation of copper precipitates. Typically, boron doped silicon wafers have a boron concentration sufficient to obtain a resistivity of less than about 100 ohms-cm.

Integrated circuit manufacturers generally require that the concentration of copper on the surface of a silicon wafer be no more than $1\times10^{10}$ atoms/cm$^2$ to $1\times10^{11}$ atoms/cm$^2$, as determined by methods standard in the art. It is foreseeable that this requirement will be decreased to a value of $5\times10^9$ atoms/cm$^2$, $1\times10^9$ atoms/cm$^2$ or less since a large fraction of random device failures can be traced to copper silicide precipitates. Under appropriate conditions, copper reacts with silicon to form a copper silicide precipitate, sometimes referred to as haze defects because, upon being subjected to a common etching treatment and bright light inspection, such defects appear as a haze on the surface of the wafer.

In the past, it has been observed that chemomechanical polishing of boron doped, p type silicon wafers results in a temporary increase in electrical resistivity of the wafers. Early research into this phenomenon suggested that this effect was the result of acceptor neutralization by hydrogen, which was being incorporated into the silicon matrix of the wafers. It was noted in this regard that, upon being heated to 180° C. for 30 minutes, the initial acceptor activity in the wafers was mostly restored. (See Schnegg et al., *Mat. Res. Soc. Symp. Proc.*, 104 (1988), pp. 291–96.) Recently, however, studies have shown that the increase in resistivity is the result of copper, as opposed to hydrogen, being incorporated into the wafers during the chemomechanical polishing process. (See, e.g., Prigge et al., *J. Electrochem. Soc.*, 138 (1991), pp. 1385–89.) This is a surprising discovery because wafer polishing typically occurs at room temperature. The solubility of copper in a silicon wafer is so low at room temperature that any copper present should typically be found on the surface.

Referring now to FIG. 1, immediately after wafers have undergone conventional polishing treatments and state of the art cleaning methods, the copper concentration on the surface of the wafers is less than $1\times10^{10}$ atoms/cm$^2$, as determined by total reflection spectroscopy (TXRF) measurements. (See, e.g., C. Neumann et al., *Spectrochemica Acta*, 10 (1991), pp. 1369–1377; Ingle & Crouch, *Spectrochemical Analysis*, Prentice Hall, 1988.) The surface copper concentration of these wafers, however, increases with the passage of time even at room temperature until saturation is reached. Thus, wafers which meet a target specification for copper surface concentration immediately after cleaning may fail to meet this specification as soon as five to ten months later.

Gettering has been used in the past in an attempt to trap copper and other metals and prevent these contaminants from reaching the device region of the wafer. Such an approach has not proven to be entirely effective for copper, however, due to the high diffusivity of copper in silicon which makes it possible for copper to escape from the gettering sites and reach the device region of the wafer.

Prigge et al. (DE 3939661 A1) proposed a process to address the problem of copper incorporation during wafer polishing in which an attempt is made to limit the amount of copper actually incorporated into the wafer. This is accomplished by means of admixing with polishing agents certain reagents which form a coordination complex with copper. This coordination complex acts to maintain the copper in a specific conformation which limits the ability of copper to enter the silicon.

While the amount of copper incorporated into the wafers varies, depending upon the many factors associated with available polishing methods, no method has been found which is completely free of this effect. Therefore, a need continues to exist for a process which allows for the removal of copper from polished, boron-doped silicon wafers.

SUMMARY OF THE INVENTION

Among the objects of the present invention, therefore, may be noted the provision of a process for removing copper from boron doped silicon wafers; and, the provision of a process for preparing p type, boron doped silicon wafers which are free of haze defects.

Briefly, therefore, the present invention is directed to a process for removing copper from a boron doped, polished silicon wafer which contains copper on its polished surface and in its interior. In the process, the wafer is annealed at a temperature of at least about 75° C. to increase the concentration of copper on the polished surface of the wafer and decrease the concentration of copper in the interior of the wafer. The polished surface of the annealed wafer is then cleaned to reduce the concentration of copper thereon. Significantly, the annealing step is carried out at a temperature and a time such that the concentration of copper on the polished surface of the silicon will not increase by a factor of more than two upon storage of the annealed and cleaned wafer at room temperature for a period of 5 months.

The present invention is further directed to a process for removing copper from a boron doped, polished silicon wafer which contains copper on its polished surface and in its interior. The wafer is annealed at a temperature of at least about 100° C. to increase the concentration of copper on the polished surface of the wafer and decrease the concentration of copper in the interior of the wafer. The polished surface of the annealed wafer is then cleaned to reduce the concentration of copper thereon to a value of less than about $5\times10^9$ atoms/cm$^2$.

Other objects and features of this invention will be in part apparent and in part pointed out hereinafter.

BRIEF DESCRIPTION OF THE DRAWINGS

FIG. 2 is a chart which illustrates how the log of the concentration of copper on the surface of two sets of polished, p type wafers, as determined by vapor phase decomposition/atomic absorption spectroscopy measurements (VPD/AA), changes at various stages in the process.

DETAILED DESCRIPTION OF THE PREFERRED EMBODIMENTS

Figure 1:
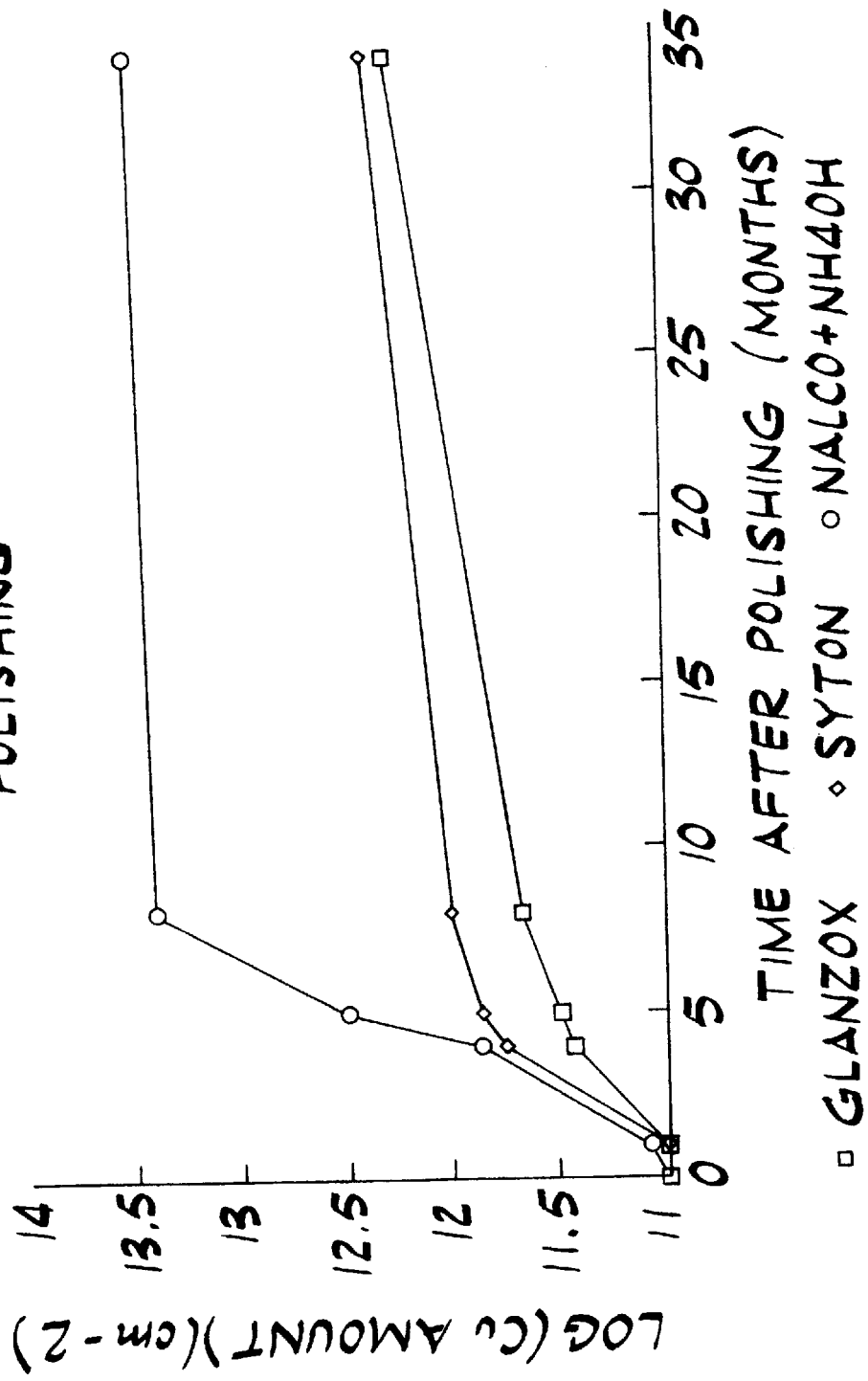
FIG. 1 is a chart which illustrates how the log of the concentration of copper on the surface of three p type wafers, as determined by total reflection spectroscopy (TXRF) measurements, immediately after each has undergone a different type of polishing process, changes with the passage of time.

Without being bound to any particular theory, it is believed that copper forms some sort of complex with boron and is incorporated or "stored" in this form in boron doped silicon wafers. It is additionally believed that these copper-boron complexes are metastable, even at room temperature. As time passes, therefore, these complexes dissociate allowing copper to assume an interstitial position. Copper is a rapid diffuser in silicon; the most rapid of all metals and is very mobile even at room temperature. In addition, however, its solubility in silicon is strongly temperature dependent and at low temperatures, e.g., room temperature, it is very low. At low temperatures, therefore, interstitial copper will rapidly diffuse to the surface of the wafer.

The increase in the concentration of copper on the surface of a wafer as a function of time depends, in part, upon the amount of copper which is contributed by the polishing process and, in part, upon the boron concentration of the wafer. As the boron concentration of the wafer increases, the "storage" capacity for copper and the potential for time-dependent copper surface concentration likewise increase.

Subjecting boron doped wafers to a low temperature anneal for a relatively short period of time in accordance with the present invention increases the rate at which the copper-dopant complexes dissociate and copper diffuses to the surface from the bulk of the wafer. Referring now to FIG. 2, it can be seen that, after polishing, a low temperature anneal (denoted "After Low Temp. T.T.") results in more than a ten-fold increase in the copper concentration on the surfaces of the tested wafers, as determined by vapor phase decomposition/atomic absorption spectroscopy measurements (VPD/AA). (See, e.g., C. Neumann et al., *Spectrochemica Acta*, 10 (1991), pp. 1369–1377; N. Streckfub et al., *Fresenius J. Anal. Chem.*, 343 (1992) pp. 765–768.)

In general, temperatures of less than about 500° C. are preferred for the annealing step of the present invention. At substantially greater temperatures, e.g., temperatures in excess of about 600° C., the copper-dopant complexes dissociate and the newly released copper will typically be present in the silicon below its solubility limit. As the wafer is cooled from 600° C., however, the solubility of copper in silicon rapidly decreases and, if there is sufficient copper present, energy barriers will be overcome and it will precipitate. At temperatures in the range of 500° C. and less, the copper-dopant complexes dissociate and the copper is released into silicon in which it is typically not soluble. As a result, the copper rapidly diffuses to surface of the wafer without forming a precipitate; stated another way, the energy barrier for the precipitation reaction is never exceeded and the copper is present on the surface of the wafer in a form in which it, like other copper surface contaminants, can be cleaned from the surface using standard, state of the art cleaning chemistries.

The duration of the annealing step is a function of the annealing temperature, with the time and temperature being selected to achieve the desired effect, i.e., diffusion of a sufficient quantity of copper to the surface of the silicon wafer from the wafer bulk (e.g., regions of the wafer which are at distances more than 5 micrometers from the surface of wafer). For a given copper concentration, a greater anneal temperature will require a shorter duration; likewise, a lesser anneal temperature will require a longer duration.

Typically, the polished, boron doped wafers are annealed at one or more temperatures within the range of about 75° C. to about 500° C. for a duration of about 30 seconds to about 10 hours or more, with the shorter times being used for the higher temperatures and vice versa. The wafers are preferably annealed at a temperature of at least about 100° C., more preferably at a temperature of at least about 150° C., still more preferably at a temperature of at least about 200° C., and, for some applications, still more preferably at a temperature between about 225° C. and about 300° C. At temperatures in the range of about 100° C. to about 200° C., the annealing time will typically be in the range of about 0.5 to about 3 hours. At temperatures in the range of about 225° C. to about 300° C., the annealing time will typically be in the range of at least about several minutes (e.g., about 3 or 5 minutes) or even several tens of minutes (e.g., about 30 minutes) to about 1.5 hours.

The wafers may be annealed in a furnace, preferably a tube furnace. Depending upon the temperature range that is to be employed with the present process, however, heated rooms may also be used. The low temperature anneal process is typically carried out under an inert gas atmosphere, preferably a nitrogen atmosphere. An inert atmosphere, however, is not required and experience has shown that air is also acceptable.

Alternatively, the wafers may be annealed while immersed in a liquid. When temperatures of up to about 100° C. are desired, water may be used as the liquid. Experience has shown that the only limitation on the type of solution which may be used in the present low temperature anneal process is that the solution must not roughen or otherwise materially degrade the finish of the wafer.

After the low temperature anneal step is complete, the wafer is subjected to a cleaning step which effectively removes copper to a surface concentration of less than about $1 \times 10^{10}$ atoms/cm$^2$, preferably $5 \times 10^9$ atoms/cm$^2$ and more preferably less than about $1 \times 10^9$ atoms/cm$^2$. Typical cleaning solutions include piranha mixtures (mixtures of sulfuric acid and hydrogen peroxide), RCA-type SC-1 and SC-2 cleaning solutions (see, e.g., F. Shimura, *Semiconductor Silicon Crystal Technology*, Academic Press, 1989, pp. 188–191 and Appendix XII, incorporated herein by reference). The wafers may be immersed in the cleaning solution, or alternatively, exposed to scrubbing jets.

An RCA-type SC-1 solution removes organic contaminants and particles by both the solvating action of ammonium hydroxide and the powerful oxidizing action of hydrogen peroxide; typical SC-1 cleaning solutions contain between about 1000:1:1 to 1:1:1 parts by volume $H_2O:H_2O_2:NH_4OH$ (supplied as 30–35 weight percent $H_2O_2$ in water and 28–30 weight percent $NH_4OH$ in water); that is, the SC-1 cleaning solution contains $H_2O$, $H_2O_2$ and $NH_4OH$ and the ratio of $H_2O$ to $H_2O_2$ (supplied as 30–35 weight percent $H_2O_2$ in water) is between about 1000:1 and 1:1, the ratio of $H_2O$ to $NH_4OH$ (supplied as 28–30 weight percent $NH_4OH$ in water) is between about 1000:1 and 1:1, and the ratio of $H_2O$ to $H_2O_2$ is independent of the ratio of $H_2O$ to $NH_4OH$. Preferred SC-1 cleaning solutions contain about 100:1:1 to about 5:1:1 parts by volume $H_2O:H_2O_2:NH_4OH$, and have a temperature of about 30° C. to about 80° C., preferably about 60° C. to 80° C.

The wafers may be cleaned in an SC-1 solution for about 5 to about 30 minutes. If the wafers are immersed in the cleaning solution for a longer time, excessive etching, pitting and roughening can occur. After cleaning, the wafers are immersed in a rinse bath to quench the reaction and remove the SC-1 cleaner from the wafer surfaces. The wafers are rinsed for a period of about 2 to about 60 minutes, typically from about 5 to about 45 minutes, in deionized water having a resistivity of about 3 to about 18 mega-Ohms, preferably greater than about 17 mega-Ohms.

An RCA-type SC-2 solution typically contains about 1:1 to 1:10,000 parts by volume $HF:H_2O$ (supplied as 49 weight percent HF in water). To enhance metals removal, the solution may additionally contain HCl (1000:1 to 1:1000 parts by volume HF:HCl), hydrogen peroxide (1:1 to 1:1000 parts by volume HF to $H_2O_2$), isopropyl alcohol (10,000:1 to 1:10 parts by volume HF:IPA) or ozone (about 0.05 to about 50 ppm). A typical SC-2 bath may contain 1:1:5 to 1:1:1000 parts by volume of $HCl:H_2O_2:H_2O$. The temperature of the HF and SC-2 solutions may be about 10° C. to about 90° C., and the silicon wafers are immersed in a flowing bath of this solution for a period of at least about 0.1 minutes. These solutions effectively remove alkali and transition metals, and prevent redeposition from the solution by forming soluble metal complexes.

Because low temperatures are used in the annealing step, the copper which migrates to the surfaces of the wafers exists in its atomic form, rather than as copper silicide precipitates. Unlike these copper precipitates, copper in its atomic form can be easily removed by cleaning methods standard in the art. As a result, wafers which are annealed and then cleaned can have surface copper concentrations of less than about $1 \times 10^{10}$ atoms/cm$^2$, $5 \times 10^9$ atoms/cm$^2$, or even $1 \times 10^9$ atoms/cm$^2$, and these surface concentrations will remain relatively constant over time. For example, it may be noted from FIG. 2 that after the wafers were subjected to the low temperature annealing and cleaning steps of the present invention, the surface copper concentration remained unchanged; no additional copper diffused to the surfaces of the wafers.

In general, the process of the present invention is carried out on polished wafers, i.e., wafers having a bare silicon face (except for a native silicon dioxide layer which is invariably present on silicon exposed to air) which has been polished to provide a specular finish thereon and not on patterned wafers, i.e., wafers onto which an organic material, metal or other material has been deposited or otherwise formed on less than the entire surface of the wafer using a mask or other comparable means. Preferably, the process is carried out immediately after polishing and before any silicon wafer processing step in which the wafers are heated to a temperature in excess of 500° C.

The preferred temperature and duration of the anneal for polished wafers with known, or at least shared copper characteristics, may be determined empirically by annealing the wafers at a range of temperatures for varying lengths of time, cleaning the surface of the wafers to remove copper which is present, determining the concentration of copper on the surface of the wafers, storing the wafers for a period of months, e.g., about 5 months, or longer, and redetermining the concentration of copper on the surface of the stored wafers. If there is a significant increase in the copper concentration on the surface of the silicon (e.g., if the concentration increases by a factor of two) during this time, the annealing temperature or period may be increased for wafers of this specification to further reduce the concentration of copper in the bulk of the wafers.

The process of the present invention may be used for wafers onto which an epitaxial layer is to be deposited. Epitaxial deposition processes typically employ temperatures in the range of 1,100° C. To reduce the likelihood of copper silicide formation, therefore, the wafers may be annealed and cleaned according to the present invention prior to the epitaxial deposition process.

As illustrated by the Example, set forth below, the process of the present invention may be used to reduce the concentration of copper in polished p type silicon wafers to less than about $1 \times 10^9$ atoms/cm$^2$, as determined by either TXRF or VPD/AA. The Example sets forth only one set of conditions to be used to achieve the desired results. Accordingly, the Example should not be interpreted in a limiting sense.

EXAMPLE

Referring to FIG. 2, the initial surface copper concentrations, as determined by VPD/AA measurements, were determined for two sets of p type silicon wafers immediately after polishing was completed (denoted "After Polishing"). These two sets of wafers were then heated in a tube furnace at about 200° C. for about 1 hour. After the wafers were allowed to cool, the surface copper concentration was again determined (denoted "After Low Temp. T.T.").

The wafers were then cleaned using an RCA-type method, as discussed above. The two sets of wafers were again analyzed for surface copper concentrations (denoted "After Low Temp.+Clean"). The wafers were then stored at room temperature for 6 months and once again analyzed (denoted "T.T.+Clean+6 months"). The results indicate that the surface copper levels remained essentially unchanged, supporting the conclusion that all measurable amounts of copper have been effectively out-diffused from the bulk of the wafers and removed.

As various changes could be made in the above method without departing from the scope of the present invention, it is intended that all matter contained in the above description shall be interpreted as illustrative and not in a limiting sense.

What is claimed is:

1. A process for preparing a boron dosed silicon wafer having a polished surface wherein copper, present on the polished surface and in the wafer interior, is removed to prevent the formation of a haze on the polished surface with the passage of time, the process comprising polishing a surface of a boron doped wafer, the polishing process contributing copper to the surface and interior of the wafer, annealing the polished wafer at a temperature of at least about 75° C. for at least about 30 seconds to increase the concentration of copper on the polished surface of the wafer and decrease the concentration of copper in the interior of the wafer, and cleaning the polished surface of the annealed wafer to reduce the concentration of copper thereon, the concentration of copper in the interior of the annealed and cleaned wafer being reduced during the annealing step such that the concentration of copper on the polished and cleaned surface of the wafer will not increase by a factor of more than two upon storage of the wafer at room temperature for a period of 5 months.

2. The process as set forth in claim 1 wherein annealing of the polished wafer is at one or more temperatures within a range of from about 100° C. to about 200° C. for about 0.5 hours to about 3 hours.

3. The process as set forth in claim 1 wherein annealing of the polished wafer is at one or more temperatures within a range of from about 225° C. to about 300° C. for at least about 30 minutes.

4. The process as set forth in claim 1 wherein annealing of the polished wafer is performed prior to subjecting to the wafer to an epitaxial deposition process.

5. The process as set forth in claim 1 wherein the annealing step is carried out in a liquid.

6. The process as set forth in claim 1 wherein the polished surface of the annealed wafer is cleaned to reduce the concentration of copper thereon to a value of less than about $1 \times 10^9$ atoms/cm$^2$.

7. A process for preparing a boron doped silicon wafer having a polished surface wherein copper, present on the polished surface and in the wafer interior, is removed to prevent the formation of a haze on the polished surface with the passage of time, the process comprising polishing a surface of a boron doped wafer, the polishing process contributing copper to the surface and interior of the wafer, annealing the polished wafer at a temperature of at least about 100° C. for at least about 30 seconds to increase the concentration of copper on the polished surface of the wafer and decrease the concentration of copper in the interior of the wafer, and cleaning the polished surface of the annealed wafer to reduce the concentration of copper thereon to a value of less than about $5 \times 10^9$ atoms/cm$^2$.

8. The process as set forth in claim 7 wherein the polished wafer is annealed at one or more temperatures within a range of from about 100° C. to about 200° C. for about 0.5 hours to about 3 hours.

9. The process as set forth in claim 7 wherein the polished wafer is annealed at one or more temperatures within a range of from about 225° C. to about 300° C. for at least about 30 minutes.

10. The process as set forth in claim 7 wherein the polished wafer is annealed prior to subjecting to the wafer to an epitaxial deposition process.

11. The process as set forth in claim 7 wherein the annealing step is carried out in a liquid.

12. The process as set forth in claim 7 wherein the polished surface of the annealed wafer is cleaned to reduce the concentration of copper thereon to a value of less than about $1 \times 10^9$ atoms/cm$^2$.

13. A process for preparing a boron doped silicon wafer having a polished surface wherein copper, present on the polished surface and in the wafer interior, is removed to prevent the formation of a haze on the polished surface with the passage of time, the process comprising polishing a surface of a boron doped wafer, the polishing process contributing copper to the surface and interior of the wafer, annealing the polished wafer at a temperature of at least about 200° C. for at least about 30 seconds to increase the concentration of copper on the polished surface of the wafer and decrease the concentration of copper in the interior of the wafer, and cleaning the polished surface of the annealed wafer to reduce the concentration of copper thereon to a value of less than about $5 \times 10^9$ atoms/cm$^2$.

14. The process as set forth in claim 13 wherein the polished the wafer is annealed at one or more temperatures within a range of from about 225° C. to about 300° C. for at least about 30 minutes.

15. The process as set forth in claim 13 wherein the polished wafer is performed prior to subjecting to the wafer to an epitaxial deposition process.

16. The process as set forth in claim 13 wherein the annealing step is carried out in a liquid.

17. The process as set forth in claim 13 wherein the polished surface of the annealed wafer is cleaned to reduce the concentration of copper thereon to a value of less than about $1 \times 10^9$ atoms/cm$^2$.

* * * * *

UNITED STATES PATENT AND TRADEMARK OFFICE
CERTIFICATE OF CORRECTION

PATENT NO. : 6,100,167
DATED : August 8, 2000
INVENTOR(S) : Robert J. Falster, Fabrizio Leoni, Marco Bricchetti, Alessandro Corradi It is certified that error appears in the above-identified patent and that said Letters Patent is hereby corrected as shown below:

Column 6, claim 1,
Line 30, "boron dosed silicon" should read -- boron doped silicon --.

Column 7, claim 10,
Line 27, "subjecting to the wafer to" should read -- subjecting the wafer to --.

Column 8, claim 14,
Lines 19-20, "the polished the wafer" should read -- the polished wafer --.

Column 8, claim 15,
Lines 24-25, "polished wafer is performed prior to subjecting to the wafer to an epitaxial deposition process." should read -- polished wafer is annealed prior to subjecting the wafer to an epitaxial deposition process --.

Signed and Sealed this

Fourth Day of December, 2001

*Attest:*

*Attesting Officer*

NICHOLAS P. GODICI
*Acting Director of the United States Patent and Trademark Office*